US009206308B2

(12) United States Patent
Iwami et al.

(10) Patent No.: US 9,206,308 B2
(45) Date of Patent: Dec. 8, 2015

(54) EPOXY RESIN COMPOSITION FOR PREPREG, PREPREG, AND MULTILAYER PRINTED CIRCUIT BOARD

(75) Inventors: Tomoaki Iwami, Fukushima (JP); Masaaki Matsumoto, Fukushima (JP); Tomoyuki Abe, Fukushima (JP); Tatsuo Yonemoto, Fukushima (JP); Hiroaki Fujiwara, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 571 days.

(21) Appl. No.: 13/637,629

(22) PCT Filed: Mar. 22, 2011

(86) PCT No.: PCT/JP2011/056841
§ 371 (c)(1),
(2), (4) Date: Dec. 17, 2012

(87) PCT Pub. No.: WO2011/118584
PCT Pub. Date: Sep. 29, 2011

(65) Prior Publication Data
US 2013/0096233 A1 Apr. 18, 2013

(30) Foreign Application Priority Data
Mar. 26, 2010 (JP) .................. 2010-073443

(51) Int. Cl.
H05K 1/03 (2006.01)
B32B 27/04 (2006.01)
B32B 27/20 (2006.01)
B32B 27/26 (2006.01)
B32B 27/38 (2006.01)
C08K 3/10 (2006.01)
C08K 3/22 (2006.01)
C08L 63/00 (2006.01)
C08G 59/22 (2006.01)
C08G 59/30 (2006.01)
C08G 59/38 (2006.01)
C08G 59/62 (2006.01)
C08G 59/40 (2006.01)
C08J 5/24 (2006.01)
C08K 9/02 (2006.01)
(Continued)

(52) U.S. Cl.
CPC ............. *C08L 63/00* (2013.01); *C08G 59/4021* (2013.01); *C08G 59/621* (2013.01); *C08J 5/24* (2013.01); *C08K 3/10* (2013.01); *C08K 3/22* (2013.01); *C08K 9/02* (2013.01); *H05K 1/0353* (2013.01); *C08J 2363/00* (2013.01); *C08K 5/5313* (2013.01); *C08K 5/5397* (2013.01); *H05K 1/0326* (2013.01); *H05K 1/0366* (2013.01); *H05K 1/0373* (2013.01); *H05K 2201/012* (2013.01); *H05K 2201/0209* (2013.01); *H05K 2201/0227* (2013.01); *H05K 2201/0263* (2013.01)

(58) Field of Classification Search
USPC ......... 523/427, 428, 433, 435, 440, 442, 443, 523/457, 458, 466; 428/297.4, 413, 414, 428/416, 418, 901
See application file for complete search history.

(56) References Cited

U.S. PATENT DOCUMENTS

| 6,190,787 B1 | 2/2001 | Maeda et al. |
| 6,645,630 B1 | 11/2003 | Nakamura et al. |
| 2008/0039556 A1 | 2/2008 | Ikezawa et al. |

(Continued)

FOREIGN PATENT DOCUMENTS

| EP | 1818350 A1 | 8/2007 |
| JP | 2000-256537 A | 9/2000 |

(Continued)

OTHER PUBLICATIONS

Machine translation of JP 2002161151 A, provided by the JPO website (no date).*

(Continued)

Primary Examiner — Michael J Feely
(74) Attorney, Agent, or Firm — McDermott Will & Emery LLP

(57) ABSTRACT

The problem to be solved by the invention is to provide an epoxy resin composition for a prepreg, which is used in the manufacture of a printed circuit board containing a multilayer printed circuit board, wherein the epoxy resin composition for a prepreg is characterized by containing as essential components, a phosphorus compound that has 1.8 or more and less than 3 on average of a phenolic hydroxyl group that is reactive to an epoxy resin in the molecule, and that has 0.8 or more on average of a phosphorus element; a bifunctional epoxy resin that has 1.8 or more and less than 2.6 on average of epoxy groups in the molecule; a multi-functional epoxy resin that contains 2.8 or more on average of epoxy groups in one molecule; a hardening agent; an inorganic filler; and a molybdenum compound, wherein the epoxy resin composition for a prepreg is obtained by blending a pre-reacted epoxy resin, which is obtained by reacting at least the phosphorus compound with the bifunctional epoxy resin and the multi-functional epoxy resin, or the bifunctional epoxy resin only in advance, the bifunctional epoxy resin or the multi-functional epoxy resin, the hardening agent, the inorganic filler, and the molybdenum compound, which is excellent in flame retardance, heat resistance, thermal stiffness, and excellent in hole position accuracy without the production of a harmful substance at the time of combustion, a prepreg using the epoxy resin composition for a prepreg, and a multilayer printed circuit board using the prepreg.

17 Claims, No Drawings

(51) Int. Cl.
   *C08K 5/5313*   (2006.01)
   *C08K 5/5397*   (2006.01)

(56) References Cited

U.S. PATENT DOCUMENTS

| | | | | |
|---|---|---|---|---|
| 2009/0008127 A1 * | 1/2009 | Motobe et al. | ................ | 174/250 |
| 2009/0143511 A1 | 6/2009 | Ikezawa et al. | | |

FOREIGN PATENT DOCUMENTS

| | | | | | |
|---|---|---|---|---|---|
| JP | 2001-316564 A | | 11/2001 | | |
| JP | 2002161151 A | * | 6/2002 | ................ | G08J 5/24 |
| JP | 2002-212390 A | | 7/2002 | | |
| JP | 2003-011269 A | | 1/2003 | | |
| JP | 2003-277487 A | | 10/2003 | | |
| JP | 2003-342450 A | | 12/2003 | | |
| JP | 2005-281597 A | | 10/2005 | | |
| JP | 2005336472 A | * | 12/2005 | ............ | C09K 21/02 |
| JP | 2007-099808 A | | 4/2007 | | |
| JP | 2008-106087 A | | 5/2008 | | |
| JP | 2009-253138 A | | 10/2009 | | |
| WO | WO-2010/110433 A1 | | 9/2010 | | |

OTHER PUBLICATIONS

Machine translation of JP 2005336472 A, provided by the JPO website (no date).*
Partial translation of JP 2002-161151 A (no date).*
International Search Report mailed May 17, 2011 issued in corresponding International Application No. PCT/JP2011/056841.

* cited by examiner

EPOXY RESIN COMPOSITION FOR PREPREG, PREPREG, AND MULTILAYER PRINTED CIRCUIT BOARD

TECHNICAL FIELD

The present invention relates to an epoxy resin composition for a prepreg, which is used in the manufacture of a printed circuit board including a multilayer printed circuit board, a prepreg using the epoxy resin composition for a prepreg, a multilayer printed circuit board using the prepreg, particularly, an epoxy resin composition for a prepreg, which is optimal for the manufacture of a printed circuit board for a plastic package and a printed circuit board for a card, a prepreg, and a multilayer printed circuit board.

BACKGROUND ART

So far, a material for a printed circuit board for a plastic package or a material for a printed circuit board for a card is required to meet the three conditions shown below.

First, to have excellent flame retardance without addition of a halogen-based compound as a flame retardant, which possibly forms a compound such as polybrominated dibenzodioxin and furan having particularly strong toxicity.

Secondly, to have excellent heat resistance without generation of delamination at a temperature where lead free solder is treated, which is higher than a temperature where conventional solder comprising lead is treated by about 10 to 20° C.

Third, to have high thermal stiffness as a countermeasure for decrease of the warp of a printed circuit board due to higher temperature from use of a lead free solder than the conventional reflow temperature.

With respect to these requirements, a method is suggested, in which 110 parts or more by mass of an inorganic filler is added with respect to 100 parts by mass of an epoxy resin composition, which uses a pre-reacted epoxy resin as a base obtained by reacting a bifunctional epoxy resin and a phosphorus-containing bifunctional phenol in advance, whereby to obtain flame retardance without containing a halogen-based compound and excellent heat resistance, and to improve the thermal stiffness (for example, see Patent Document 1).

However, it is pointed out that with the method mentioned above, large variation of a hole position at the time of process occurs, and it is difficult to balance excellent hole position accuracy and excellent heat resistance, and thermal stiffness, with respect to a drill process for a small drill diameter of 0.20 mm or less associated with further higher density of a printed circuit board in recent years.

CITATION LIST

Patent Document

Patent Document 1: International Publication WO 2006/059363

SUMMARY OF THE INVENTION

Problem to be Solved by the Invention

The invention has been done in view of the circumstances mentioned above, and the object of the invention is to provide an epoxy resin composition for a prepreg, which is used in the manufacture of a printed circuit board comprising a multilayer printed circuit board, a prepreg using the epoxy resin composition for a prepreg, and a multilayer printed circuit board using the prepreg, which is excellent in flame retardance, heat resistance and thermal stiffness without production of a harmful substance at the time of combustion, and excellent in hole position accuracy.

Means For Solving Problem

To solve the problems mentioned above, the invention is characterized by the followings.

First, an epoxy resin composition for a prepreg includes, as essential components, a phosphorus compound that has 1.8 or more and less than 3 on average of a phenolic hydroxyl group that is reactive to an epoxy resin, and that has 0.8 or more on average of a phosphorus element in the molecule; a bifunctional epoxy resin that has 1.8 or more and less than 2.6 on average of epoxy groups in the molecule; a multi-functional epoxy resin that contains 2.8 or more on average of epoxy groups in one molecule; a hardening agent; an inorganic filler; and a molybdenum compound, wherein the epoxy resin composition for a prepreg is obtained by blending a pre-reacted epoxy resin, which is obtained by reacting at least the phosphorus compound, and the bifunctional epoxy resin and the multi-functional epoxy resin, or the bifunctional epoxy resin only in advance, the bifunctional epoxy resin or the multi-functional epoxy resin, the hardening agent, the inorganic filler, and the molybdenum compound.

Secondly, for the epoxy resin composition for a prepreg according to the first invention mentioned above, the pre-reacted epoxy resin is used in a blending amount of 20 mass % or more and 55 mass % or less with respect to the total epoxy resin components, wherein the bifunctional epoxy resin is at least one kind selected from a group consisting of a biphenyl type epoxy resin represented by Chemical formula (1), a naphthalene type epoxy resin represented by Chemical formula (2), a special bifunctional epoxy resin represented by Chemical formula (3), a dicyclopentadiene-containing bifunctional epoxy resin represented by Chemical formula (4), and a phenol aralkyl-containing bifunctional epoxy resin represented by Chemical formula (5) described below, wherein the hardening agent is a dicyandiamide and/or multi-functional phenolic compound, the inorganic filler is used in a blending amount of 110 parts or more by mass and less than 200 parts by mass with respect to 100 parts by mass of the epoxy resin component, and the molybdenum compound is used in a blending amount of 0.05 part or more by mass and less than 5 parts by mass with respect to 100 parts by mass of the epoxy resin component.

[Chemical formula 1]

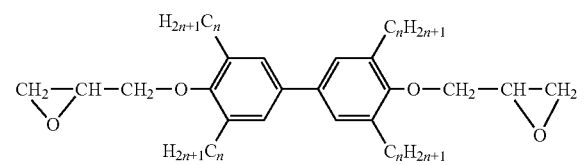

(1)

(wherein n represents an integer of 0 to 4.)

[Chemical formula 2]

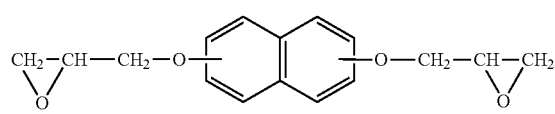

(2)

[Chemical formula 3]

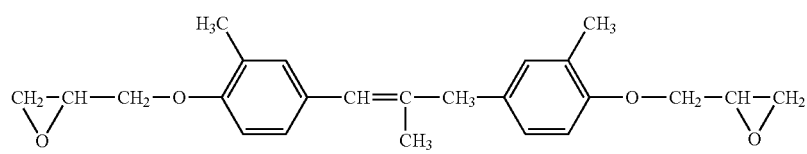

(3)

[Chemical formula 4]

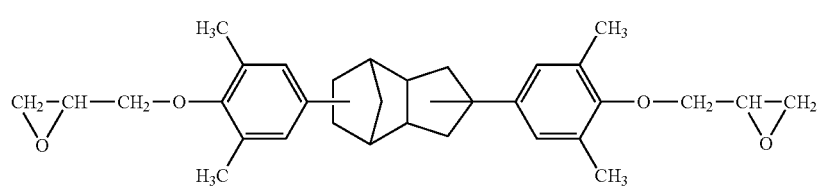

(4)

[Chemical formula 5]

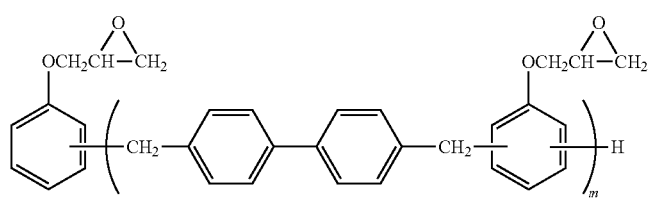

(5)

(wherein m is an integer representing the repetition number.)

Third, for the epoxy resin composition for a prepreg according to the first or second invention mentioned above, the pre-reacted epoxy resin is such that the epoxy equivalent of the bifunctional epoxy resin is 1.2 equivalents or more and less than 3 equivalents, and the epoxy equivalent of the multi-functional epoxy resin is 0.05 equivalent or more and less than 0.8 equivalent with respect to 1 equivalent of the phenolic hydroxyl group of the a phosphorus compound.

Fourth, for the epoxy resin composition for a prepreg according to the first to the third inventions mentioned above, the phosphorus compound is a phosphorus compound represented by any one of Chemical formula (6). Chemical formula (7), and Chemical formula (8) described below.

[Chemical formula 6]

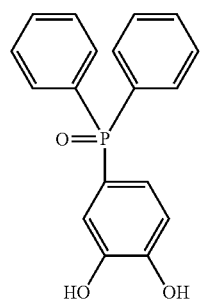

(6)

[Chemical formula 7]

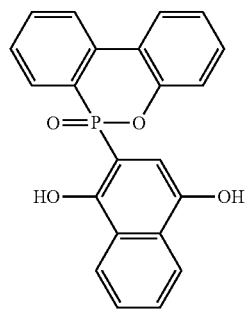

(7)

[Chemical formula 8]

(8)

Fifth, for the epoxy resin composition for a prepreg according to the first to the fourth inventions mentioned above, the content of the phosphorus element is 0.5 mass % or more and less than 3.5 mass % with respect to the total epoxy resins.

Sixth, for the epoxy resin composition for a prepreg according to the first to the fifth inventions mentioned above, the multi-functional epoxy resin is linked to a benzene ring with a bond except for a methylene bond.

Seventh, for the epoxy resin composition for a prepreg according to the first to the sixth inventions mentioned above, the inorganic filler is magnesium hydroxide alone or with a mixture of another inorganic filler.

Eighth, for the epoxy resin composition for a prepreg according to the seventh invention mentioned above, the magnesium hydroxide has a coating layer composed of silica on the surface.

Ninth, the epoxy resin composition for a prepreg according to the eighth invention mentioned above includes a second coating layer composed of at least one kind selected from alumina, titania and zirconia on the coating layer composed of silica of the magnesium hydroxide.

Tenth, the epoxy resin composition for a prepreg according to the eighth or ninth invention mentioned above is surface-treated with a surface treatment agent that is at least any one kind of a coupling agent and a siloxane oligomer after formation of the coating layer composed of silica of the magnesium hydroxide or the second coating layer.

Eleventh, for the epoxy resin composition for a prepreg according to the first to the tenth inventions mentioned above, the multi-functional phenolic compound used as a hardening agent is any multi-functional phenolic compound represented by Chemical formula (9) or (10) described below.

[Chemical formula 9]

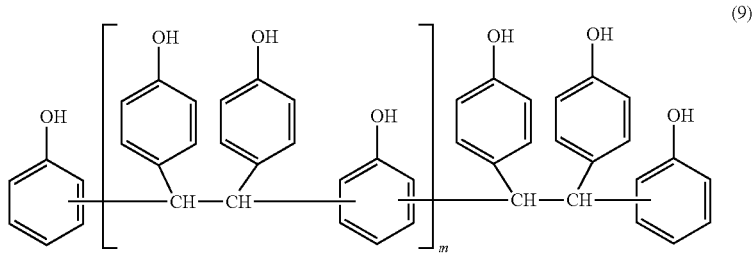

(9)

(wherein m is an integer representing the repetition number.)

[Chemical formula 10]

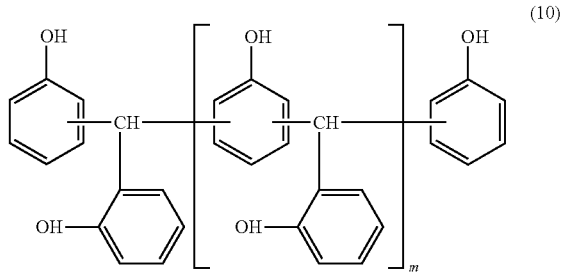

(10)

(wherein m is an integer representing the repetition number.)

Twelfth, for the epoxy resin composition for a prepreg according to the first to the eleventh inventions mentioned above, the molybdenum compound is zinc molybdate.

Thirteenth, for the epoxy resin composition for a prepreg according to the first to twelfth inventions mentioned above, the molybdenum compound is coated onto the inorganic filler.

Fourteenth, for the epoxy resin composition for a prepreg according to the thirteenth invention mentioned above, the inorganic filler onto which the molybdenum compound is coated is at least any one kind of talc, aluminum hydroxide, boehmite, magnesium hydroxide and silica.

Fifteenth, for the epoxy resin composition for a prepreg according to the thirteenth or fourteenth invention mentioned above, the inorganic filler on which the molybdenum compound is coated has an average particle diameter of 0.05 μm or more.

Sixteenth, the epoxy resin composition for a prepreg according to the first to the fifteenth inventions mentioned above is a prepreg in the semi-hardened state as impregnated into a base.

Seventeenth, a multilayer printed circuit board is obtained by laminating the prepreg of the sixteenth invention mentioned above on a substrate for the inner layer on which a circuit pattern is formed.

Advantage of the Invention

According to the first invention mentioned above, the blending of the pre-reacted epoxy resin which is obtained by reacting the specific phosphorus compound, with the bifunctional epoxy resin and the multi-functional epoxy resin, or the bifunctional epoxy resin only in advance, the bifunctional epoxy resin or the multi-functional epoxy resin, the hardening agent, the inorganic filler and the molybdenum compound, makes it possible to stably prepare the epoxy resin composition for a prepreg. A multilayer printed circuit board from the composition has excellent glass transition temperature (Tg) (hereinafter, abbreviated to Tg), and has excellent flame retardance, heat resistance and thermal stiffness, and also has excellent hole position accuracy.

According to the second invention mentioned above, each component of the epoxy resin composition for a prepreg of the invention is limited to specific conditions, which makes it possible to obtain further excellent flame retardance, excellent thermal stiffness, good electrical characteristic, and good hole position accuracy.

According to the third invention mentioned above, the phosphorus compound, and the bifunctional epoxy resin, and the epoxy equivalent of the multi-functional epoxy resin, of the pre-reacted epoxy resin are specified, which makes it possible to obtain a multilayer printed circuit board that is excellent in tenacity, plasticity, adhesiveness, and thermal stress relaxation.

According to the fourth or the fifth invention mentioned above, the phosphorus compound is specified, and the content of the phosphorus element is specified, which makes it possible to further enhance the flame retardance and heat resistance of the multilayer printed circuit board.

According to the sixth invention mentioned above, those in which a benzene ring is linked with a bond except for a methylene bond is used as the multi-functional epoxy resin, which makes it possible to suppress the viscosity of the epoxy resin composition for a prepreg to a low viscosity, and smoothly perform the impregnation into a base.

According to the seventh invention mentioned above, the inorganic filler is limited to magnesium hydroxide alone or with a mixture of another inorganic filler, which makes it possible to obtain excellent hole position accuracy and flame retardance.

According to the eighth or the ninth invention mentioned above, the magnesium hydroxide has a specific coating layer on the surface thereof, which makes it possible to give excellent resistance against an acid.

According to the tenth invention mentioned above, the magnesium hydroxide is surface-treated after the formation of the coating layer composed of silica or the second coating layer, which makes it possible to enhance the adhesive force.

According to the eleventh invention mentioned above, the multi-functional phenolic compound used as the hardening agent is specified, which makes it possible to obtain a multi-layer printed circuit board having high Tg.

According to the twelfth invention mentioned above, the molybdenum compound is specified to zinc molybdate, which makes it possible to obtain those having good flame retardance.

According to the thirteenth to the fifteenth inventions mentioned above, the molybdenum compound is coated onto a specific inorganic filler, which makes it possible to increase the contact area with the resin, whereby to obtain better flame retardance and better hole position accuracy.

According to the sixteenth invention mentioned above, the epoxy resin composition for a prepreg according to any one of the first to the fifteenth inventions mentioned above is applied to a prepreg, which makes it possible to obtain a prepreg having good impregnation.

According to the seventeenth invention mentioned above, it is possible to realize the remarkable effects described above as the multilayer printed circuit board.

MODE FOR CARRYING OUT THE INVENTION

Hereinafter, embodiments of the invention will be explained.

(Phosphorus Compound)

As the phosphorus compound used in the invention, those having 1.8 or more and less than 3 on average of the phenolic hydroxyl group that is reactive to the epoxy resin in the molecule, and having 0.8 or more on average of a phosphorus element may be used without particular limitation.

If the phenolic hydroxyl group in one molecule is less than 1.8 on average, it is impossible to obtain a linear high molecular compound, which is produced by the reaction with the bifunctional epoxy resin described below. If the phenolic hydroxyl group in one molecule is 3 or more on average, gelation occurs by the reaction with the bifunctional epoxy resin or the multi-functional epoxy resin described below, and it is not possible to stably prepare the epoxy resin composition.

In addition, if the phosphorus element in one molecule is less than 0.8 on average, it becomes impossible to obtain sufficient flame retardance. In addition, the substantial upper limit number of the phosphorus element is 2.5 on average.

The content of the phosphorus element is preferably 0.5 mass % or more and less than 3.5 mass % of the total epoxy resins in the epoxy resin composition for a prepreg. If the content of the phosphorus element is within the range mentioned above, it is possible to obtain sufficient flame retardance without addition of a halogen compound to the epoxy resin. If the content of the phosphorus element is less than 0.5 mass %, it is not possible to obtain sufficient flame retardance. If the content of the phosphorus element is 3.5 mass % or more, it becomes easy for the multilayer printed circuit board to absorb moisture, and the heat resistance is likely to decrease.

As the phosphorus compound, any phosphorus compound represented by Chemical formula (6), Chemical formula (7), Chemical formula (8) shown below may be used, particularly preferably.

[Chemical formula 11]

(6)

[Chemical structure showing compound with two phenyl groups, O=P, and a dihydroxyphenyl group with HO and OH]

[Chemical formula 12]

(7)

[Chemical structure showing dibenzofuran-like structure with O=P—O and a dihydroxynaphthyl group with HO and OH]

[Chemical formula 13]

(8)

[Chemical structure showing dibenzofuran-like structure with O=P—O and a dihydroxyphenyl group with HO and OH]

By using these, it is possible to further improve flame retardance and heat resistance of the multilayer printed circuit board in comparison to a case of using a phosphorus compound that has other bifunctional phenolic hydroxyl groups. These may be used as one kind alone, or may be used in combination of 2 kinds or more.

(Epoxy Resin)

As the epoxy resin used in the invention, it contains a bifunctional epoxy resin that has 1.8 or more and less than 2.6 on average of epoxy groups resin in one molecule, and a multi-functional epoxy resin that contains 2.8 or more on average of epoxy groups in one molecule.

(Bifunctional Epoxy Resin)

As the bifunctional epoxy resin used in the invention, those having 1.8 or more and less than 2.6 on average of the average number of the epoxy group in one molecule, may be used without particular limitation.

If the epoxy group in one molecule of the bifunctional epoxy resin is less than 1.8 on average, it is impossible to obtain a linear high molecule by the reaction with the phosphorus compound mentioned above. If the epoxy group in one molecule of the bifunctional epoxy resin is 2.6 or more on average, gelation occurs easily by the reaction with the phosphorus compound mentioned above, and it becomes impossible to stably prepare the epoxy resin composition.

As the bifunctional epoxy resin, any one of a biphenyl type epoxy resin represented by Chemical formula (1), a naphthalene type epoxy resin represented by Chemical formula (2), a special bifunctional epoxy resin represented by Chemical formula (3), a dicyclopentadiene-containing bifunctional epoxy resin represented by Chemical formula (4) and a phenol aralkyl-containing bifunctional epoxy resin represented by Chemical formula (5) described below may be used, particularly suitably.

[Chemical formula 14]

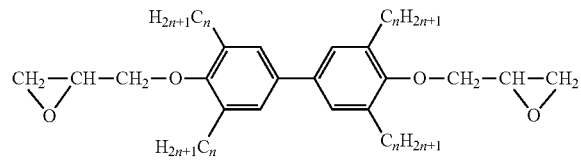

(1)

(wherein n represents an integer of 0 to 4.)

[Chemical formula 15]

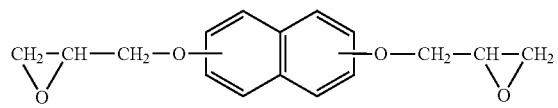

(2)

[Chemical formula 16]

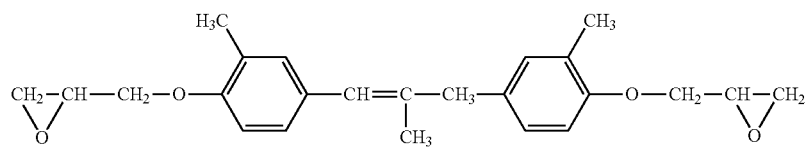

(3)

[Chemical formula 17]

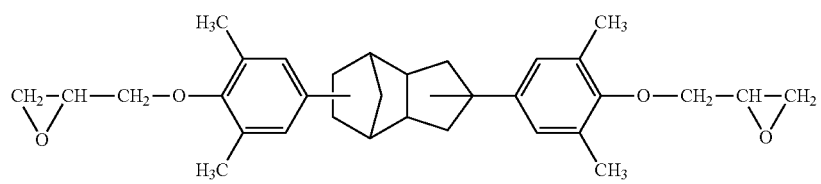

(4)

[Chemical formula 18]

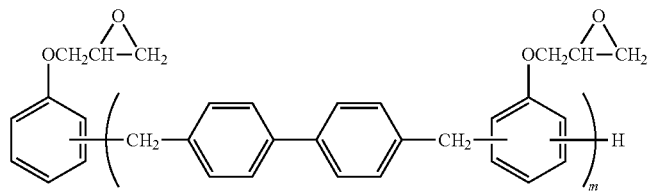

(5)

(wherein m is an integer representing the repetition number.)

By using these, it is possible to further enhance Tg of the multilayer printed circuit board in comparison with a case of using a general epoxy resin such as a bisphenol A type epoxy resin, and have good strength at the time of heating to high temperature since these have stiffness.

(Multi-Functional Epoxy Resin)

As the multi-functional epoxy resin used in the invention, those having 2.8 or more on average, preferably 2.8 or more and less than 3.8 on average of the average number of the epoxy group in one molecule may be used without particularly limitation of other molecular structures.

By blending a multi-functional epoxy resin of which the average number of the epoxy group is 2.8 or more, it is possible to obtain excellent Tg. If the number of the epoxy group is less than 2.8 on average, the cross-linking density of the multilayer printed circuit board is insufficient, and it is not possible to obtain effects of enhancing Tg.

In addition, by setting the average number of the epoxy group to a range of 2.8 or more and less than 3.8, the viscosity becomes low since the molecular weight is suppressed low without drastical increase of the molecular weight despite the reaction of the phosphorus compound and the bifunctional epoxy resin, and it is possible to stably prepare the epoxy resin composition for a prepreg.

As the multi-functional epoxy resin mentioned above, for example, a phenol novolac type epoxy resin, a cresol novolac type epoxy resin, a dicyclopentadiene-containing phenol novolac type epoxy resin, or a multi-functional epoxy resin linked to a benzene ring with a bond except for a methylene bond may be used preferably.

Any of these has low reactivity, and thus an epoxy resin composition for a prepreg prepared using these has low viscosity, and particularly, it becomes possible to smoothly perform impregnation into a base, and the like.

The multi-functional epoxy resin is particularly preferably the dicyclopentadiene-containing phenol novolac type epoxy resin, or the multi-functional epoxy resin linked to a benzene ring with a bond except for a methylene bond since they makes it possible to remarkably enhance Tg of the obtained multilayer printed circuit board, and improve the adhesion and makes it difficult to the absorb moisture.

The multi-functional epoxy resin mentioned above may be used as one kind alone, or may be used in combination of 2 kinds or more.

(Pre-Reacted Epoxy Resin)

The pre-reacted epoxy resin of the invention is obtained by pre-reacting the phosphorus compound, and both of the bifunctional epoxy resin and the multi-functional epoxy resin, or the bifunctional epoxy resin alone in advance.

This pre-reacted epoxy resin is preferably those obtained by reacting 80 mass % or more of the phosphorus compound and the total or a portion of the epoxy resin.

If the phosphorus compound is less than 80 mass %, unreacted phosphorus-containing bifunctional phenol compound remains largely, and it becomes not possible to improve solder heat resistance or chemical resistance after moisture absorption of the multilayer printed circuit board. In addition, it may have bad influence on long-term insulation reliability and the like.

In addition, the pre-reacted epoxy resin is established such that the epoxy equivalent of the bifunctional epoxy resin is 1.2 equivalents or more and less than 3 equivalents with respect to 1 equivalent of the phenolic hydroxyl group of the phosphorus compound, and the epoxy equivalent of the multi-functional epoxy resin is established to be 0.05 equivalent or more and less than 0.8 equivalent.

By establishing the epoxy equivalent of the bifunctional epoxy resin as mentioned above, it makes it possible to produce linear high molecular compounds sufficiently, and as results, it is possible to obtain a multilayer printed circuit board that is excellent in tenacity, flexibility, adhesive force, and thermal stress relaxation.

In addition, by establishing the epoxy equivalents of the bifunctional epoxy resin and the multi-functional epoxy resin as mentioned above, it makes it possible to balance high Tg and solder heat resistance.

If the bifunctional epoxy resin is less than 1.2 equivalent, the tenacity disappears, and it becomes impossible to improve solder heat resistance or chemical resistance after moisture absorption of the multilayer printed circuit board. If the bifunctional epoxy resin is 3.0 equivalents or more, the heat resistance or the glass transition temperature becomes worse.

In addition, if the multi-functional epoxy resin is less than 0.05 equivalent, it may not be possible to enhance Tg of the multilayer printed circuit board. Conversely, if the multi-functional epoxy resin is 0.8 equivalent or more, it may become impossible to stably obtain the pre-reacted epoxy resin.

The pre-reacted epoxy resin mentioned above is blended in 20 mass % or more and 55 mass % or less with respect to the total epoxy resins. If the blending amount of the pre-reacted epoxy resin is less than 20 mass % with respect to the total epoxy resins, effects of flame retardance may not be sufficiently obtained. In addition, if the blending amount of the pre-reacted epoxy resin is more than 55 mass %, the viscosity of the epoxy resin increases, and it may become impossible to fill enough inorganic fillers, and it may become impossible to obtain the stiffness of the substrate.

(Hardening Agent)

As the hardening agent used in the invention, dicyandiamide and/or multi-functional phenolic compound may be used. They give good electrical characteristic, and hardens the linear high molecular compound, which is the product of the reaction of the phosphorus compound that has a bifunctional phenolic hydroxyl group and the bifunctional epoxy resin described above, whereby make it possible to obtain a multilayer printed circuit board that is excellent in tenacity, flexibility, the adhesive force, and thermal stress relaxation.

As the multi-functional phenolic compound, those represented by Chemical formula (9) or Chemical formula (10) shown below are particularly preferable.

[Chemical formula 19]

(9)

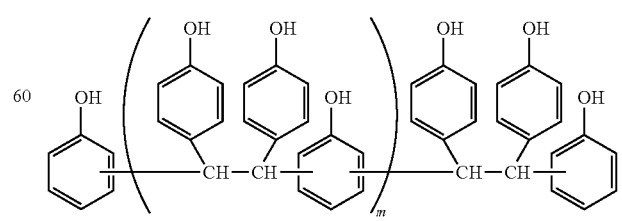

(wherein m is an integer representing the repetition number.)

[Chemical formula 20]

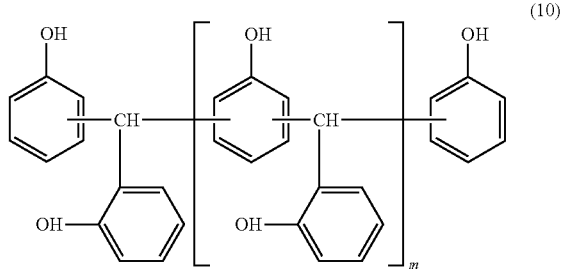

(wherein m is an integer representing the repetition number.)

By using these, it becomes possible to obtain a multilayer printed circuit board that has high heat resistance, and high Tg.

(Inorganic Filler)

As the inorganic filler used in the invention, conventionally used inorganic fillers may be used. Examples of such inorganic fillers include magnesium hydroxide, silica, talc, metal hydroxide, metal oxide and the like. These inorganic fillers may be used as one kind alone, or may be used in combination of 2 kinds or more.

Among these inorganic fillers, magnesium hydroxide is particularly preferable since magnesium hydroxide is soft having 2 of Mohs' hardness, and permits dehydration to occur by heating, whereby to make it possible to easily ensure that a laminate obtained using this has excellent hole position accuracy and flame retardance.

In addition, magnesium hydroxide preferably has a coating layer composed of silica on the surface thereof. By forming the coating layer composed of silica, it becomes possible to be strong acid resistance, and to prevent the appearance deterioration with acid treatment process in the manufacture of a printed circuit board.

Furthermore, by forming a second coating layer composed of at least one kind selected from alumina, titania and zirconia on the coating layer composed of silica of the magnesium hydroxide, it makes it possible to further the reinforce acid resistance.

The magnesium hydroxide mentioned above may be used as one kind alone, or may be used in combination with another inorganic filler.

In addition, an inorganic filler containing magnesium hydroxide, or magnesium hydroxide coated with silica and the like on the surface thereof, is preferably treated with at least one kind of a surface treatment agent selected from a coupling agent and a silicone oligomer. By conducting such surface treatment, it makes it possible to further reinforce the adhesive force with the resin.

Examples of the coupling agent mentioned above include an epoxy silane-based coupling agent, an amino silane-based coupling agent, a mercapto silane-based coupling agent, a vinyl silane-based coupling agent, a phenyl silane-based coupling agent, a titanate-based coupling agent and the like.

In addition, examples of the silicone oligomer include a methylmethoxy silicone oligomer, a methylphenylmethoxy silicone oligomer and the like. Furthermore, the surface treatment may be carried out with dry process and the like.

The blending amount of the inorganic filler is blended in a range of 110 parts or more by mass and less than 200 parts by mass with respect to 100 parts by mass of the resin solid content. By setting the blending amount of the inorganic filler to those mentioned above, it makes it possible to obtain thermal stiffness. Furthermore, if the inorganic filler is less than 110 parts by mass with respect to 100 parts by mass of the resin solid content, thermal stiffness may not be obtained. In addition, if the inorganic filler is 200 parts or more by mass, the adhesive force or the like may decrease.

(Molybdenum Compound)

Examples of the molybdenum compound used in the invention include zinc molybdate, calcium molybdate and the like. Among them, zinc molybdate, which makes it possible to expect better expression of flame retardance, may be used particularly preferably.

The blending amount of the molybdenum compound is in a range of 0.05 part or more by mass and less than 5 parts by mass, with respect to 100 parts by mass of the resin solid content. By setting the blending amount of the molybdenum compound to those mentioned above, it is possible to obtain good flame retardance and good hole position accuracy. Furthermore, if the molybdenum compound is less than 0.05 part by mass with respect to 100 parts by mass of the resin solid content, effects of improving the flame retardance may not be seen nearly. In addition, if the molybdenum compound is 5 parts or more by mass, the thermal decomposition temperature or the like may decrease.

In addition, by using the molybdenum compound mentioned above as coated onto the inorganic filler, it becomes possible to increase the contact area with the resin, and obtain better flame retardance and better hole position accuracy.

As the inorganic filler onto which the molybdenum compound is coated, talc, aluminum hydroxide, boehmite, magnesium hydroxide or silica may be suitably used, which is conventionally used as an inorganic filler of a laminate.

The particle diameter on average of the inorganic filler onto which these molybdenum compounds are coated, is preferably 0.05 μm or more.

(Other Components)

In the invention, in addition to the components mentioned above, an epoxy resin besides those mentioned above, a pigment, a dye, a hardening accelerator, various modifiers or an additive may be suitably blended as necessary.

For example, a blackened epoxy resin composition for a prepreg, to which a black pigment or dye is added, is impregnated into a base such as a glass cloth, and dried and semi-hardened, and the printed circuit board thus obtained using the prepreg increases the accuracy of automatic image examination (AOI examination) at the time of examination of the inner layer circuit, and also gives UV shielding and thus is useful.

As the black pigment mentioned above, a conventional, known black pigment, for example, carbon black and the like may be used. In addition, as the black dye, a conventional, known black dye may be used, for example, disazo-based, azine-based dye and the like.

In addition, as the hardening accelerator, a conventional, known hardening accelerator may be used. Examples of such hardening accelerator include tertiary amines, imidazoles and the like.

In addition, as the modifier, a gum component may be used, for example, a polyvinyl acetal resin, a styrene-butadiene gum (SBR), a butadiene gum (BR), a butyl gum, a butadiene-acrylonitrile copolymer gum, and the like may be used.

(Prepreg)

The epoxy resin composition thus obtained as mentioned above may be dissolved and diluted in a solvent as necessary to prepare a varnish. This varnish may be impregnated into a base, and dried in a dryer, for example, at a temperature of 120 to 190° C. or so for 3 to 15 minutes or so, whereby to manufacture a prepreg in the semi-hardened state (B-stage).

As the base, a glass fiber material such as a glass cloth, a glass paper and a glass mat, and in addition, a craft paper, a natural fiber cloth, an organic synthetic fiber cloth and the like may be used.

(Multilayer Printed Circuit Board)

In addition, thus manufactured prepregs may be overlapped in a necessary number, and heated and pressurized under the conditions of, for example, 140 to 200° C. and 0.98 to 4.9 MPa, whereby to manufacture a laminate.

In addition, a metal foil may be overlapped on one side or both sides of the overlapped prepregs in a desired number, and the prepregs and the metal foil may be heated and pressurized, whereby to manufacture a metal foil-clad laminate. As the metal foil, a copper foil, a silver foil, an aluminum foil, a stainless steel foil and the like may be used.

In addition, the etching treatment for the metal foil of the metal foil-clad laminate may be conducted to a substrate for the inner layer on which a circuit pattern is formed in advance, and a prepreg may be arranged on the vertical side of the substrate, and metal foils may be overlapped in a necessary number on one side or both sides of the overlapped prepreg, and the prepreg and the metal foil may be heated and pressurized, whereby to manufacture a multilayer printed circuit board.

EXAMPLES

Hereinafter, the invention will be explained specifically with Examples.

The phosphorus compound, the epoxy resin, the hardening agent, the inorganic filler, the molybdenum compound, the hardening accelerator and the solvent, which were used, are shown below in order.

<Phosphorus Compound>

As the phosphorus compound, the following 3 kinds were used.

Phosphorus compound 1: Compound of Chemical formula (8) that has 2.0 on average of phenolic hydroxyl groups, "HCA-HQ" manufactured by SANKO CO., LTD. (phosphorus content: about 9.6 mass %, hydroxyl group equivalent: about 162)

Phosphorus compound 2: Compound of Formula (7) that has 2.0 on average of phenolic hydroxyl groups, "HCA-NQ" manufactured by SANKO CO., LTD. (phosphorus content: about 8.2 mass %, hydroxyl group equivalent: about 188)

Phosphorus compound 3: Compound of Formula (6) that has 2.0 on average of phenolic hydroxyl groups (diphenyl phosphinyl hydroquinone), "PPQ" manufactured by HOKKO CHEMICAL INDUSTRY CO., LTD. (phosphorus content: about 10.1 mass %, hydroxyl group equivalent: about 155)

<Epoxy Resin>

As the epoxy resin, the following 9 kinds were used.

Epoxy resin 1: Tetramethyl biphenyl type bifunctional epoxy resin, "YX4000H" manufactured by Japan Epoxy Resin, which has Chemical formula (1) wherein n=1 (Epoxy group number: 2.0 on average, epoxy equivalent: 195)

Epoxy resin 2: Biphenyl type bifunctional epoxy resin, "YL6121" manufactured by Japan Epoxy Resin, which is a mixture of those of Chemical formula (1) wherein n=0, 1 (Epoxy group number: 2.0 on average, epoxy equivalent: 172)

Epoxy resin 3: Naphthalene type bifunctional epoxy resin of Chemical formula (2), "EPICLON-HP4032" manufactured by DAINIPPON INK AND CHEMICALS (Epoxy group number: 2.0 on average, epoxy equivalent: 150)

Epoxy resin 4: Dicyclopentadiene-containing bifunctional epoxy resin of Chemical formula (4), "ZX-1257" manufactured by Tohto Kasei Co., Ltd (Epoxy group number: 2.0 on average, epoxy equivalent: 257)

Epoxy resin 5: Phenol aralkyl type bifunctional epoxy resin of Chemical formula (5), "NC-3000" manufactured by Nippon Kayaku Co., Ltd. (Epoxy group number: 2.0 on average, epoxy equivalent: 275)

Epoxy resin 6: Multi-functional epoxy resin linked to a benzene ring with a bond except for a methylene bond, "EPPN502H" manufactured by Nippon Kayaku Co., Ltd. (Epoxy equivalent: 170)

Epoxy resin 7: Multi-functional epoxy resin linked to a benzene ring with a bond except for a methylene bond, "VG3101" manufactured by Mitsui Petrochemical (Epoxy equivalent: 219)

Epoxy resin 8: Multi-functional epoxy resin linked to a benzene ring with a bond except for a methylene bond, "FSX-220" manufactured by Sumitomo Chemical Company, Limited (Epoxy equivalent: 220)

Epoxy resin 9: Phenol novolac type multi-functional epoxy resin, "EPICLON-N740" manufactured by DAINIPPON INK AND CHEMICALS (Epoxy equivalent: 180)

<Hardening Agent>

As the hardening agent, the following 4 kinds were used.

Hardening agent 1: Dicyandiamide reagent (Molecular weight: 84, theoretical active hydrogen equivalent: 21)

Hardening agent 2: Multi-functional phenolic resin, "MEH7600" manufactured by MEIWA PLASTIC INDUSTRIES, LTD. (phenolic hydroxyl group equivalent: 100)

Structure formula: Chemical formula (9)

Hardening agent 3: Multi-functional phenolic resin, "MEH7500H" manufactured by MEIWA PLASTIC INDUSTRIES, LTD. (phenolic hydroxyl group equivalent: 100)

Structure formula: Chemical formula (10)

Hardening agent 4: Multi-functional phenolic resin, TD-2093Y manufactured by DAINIPPON INK AND CHEMICALS (phenolic hydroxyl group equivalent: 105)

Phenol novolac type phenol

<Inorganic Filler>

As the inorganic filler, the following 10 kinds were used.

Inorganic filler 1: Aluminum hydroxide, "C302A" manufactured by Sumitomo Chemical Company, Limited (average particle size: about 2 μm, thermal decomposition temperature: 280° C.)

Inorganic filler 2: Aluminum hydroxide, "C305" manufactured by Sumitomo Chemical Company, Limited (average particle size: about 5 μm, thermal decomposition temperature: 270° C.)

Inorganic filler 3: Magnesium hydroxide, "UD" manufactured by Ube Material Industries, Ltd. (average particle size: 0.5 to 5 μm, thermal decomposition temperature: 360 to 370° C.)

Inorganic filler 4: Magnesium hydroxide that has a coating layer composed of silica on the surface, "MGZ" manufactured by SAKAI CHEMICAL INDUSTRY CO., LTD. (average particle size: 0.5 to 5 μm, thermal decomposition temperature: 360 to 370° C.)

Inorganic filler 5: Magnesium hydroxide that has a coating layer composed of silica on the surface thereof, and further has a coating layer composed of alumina thereon, "Magseeds" manufactured by Konoshima Chemical Co., Ltd. (average particle size: 0.5 to 5 μm, thermal decomposition temperature: 360 to 370° C.)

Inorganic filler 6: Magnesium hydroxide obtained by further treating the inorganic filler 4 with a silane coupling agent (average particle size: 0.5 to 5 μm, thermal decomposition temperature: 360 to 370° C.)

Inorganic filler 7: Spherical silica, "Kyklos (registered trademark) MSR-04" manufactured by TATSUMORI LTD. (average particle size: about 4.1 μm, thermal decomposition temperature: 500° C. or more)

Inorganic filler 8: Spherical silica, "FB-1 SDX" manufactured by DENKI KAGAKU KOGYO KABUSIKI KAISHA (average particle size: about 1.5 μm, thermal decomposition temperature: 500° C. or more)

Inorganic filler 9: Spherical silica, "SFP-30M" manufactured by DENKI KAGAKU KOGYO KABUSIKI KAISHA (average particle size: about 0.72 μm, thermal decomposition temperature: 500° C. or more)

Inorganic filler 10: Spherical silica, "SO-C2" manufactured by Admateches (average particle size: about 0.5 μm, thermal decomposition temperature: 500° C. or more)

<Molybdenum Compound>

As the molybdenum compound, the following one was used.

Molybdenum compound 1: "Zinc molybdate" manufactured by Sigma-Aldrich Co. LLC.

In addition, as the inorganic filler coated with the molybdenum compound, the following 4 kinds were used.

Molybdenum compound 1 coated onto inorganic filler: Zinc molybdate coated onto magnesium hydroxide, "ChemGuard (registered trademark) MZM" manufactured by The Sherwin-Williams Company (amount of zinc molybdate: about 17%, average particle size of the inorganic filler: about 3 μm)

Molybdenum compound 2 coated onto inorganic filler: Zinc molybdate coated onto aluminum hydroxide, "LB398" manufactured by The Sherwin-Williams Company (amount of zinc molybdate: about 17%, average particle size of the inorganic filler: about 2 μm)

Molybdenum compound 3 coated onto inorganic filler: Zinc molybdate coated onto silica, "LB395" manufactured by The Sherwin-Williams Company (amount of zinc molybdate: about 17%, average particle size of the inorganic filler: about 0.5 μm)

Molybdenum compound 4 coated onto inorganic filler: Zinc molybdate coated onto talc, "ChemGuard (registered trademark) 911C" manufactured by The Sherwin-Williams Company (amount of zinc molybdate: about 17%, average particle size of the inorganic filler: about 4 μm)

<Hardening Accelerator>

As the hardening accelerator, the following one was used.

Hardening accelerator 1: "2-ethyl-4-methylimidazole" manufactured by SHIKOKU CHEMICALS CORPORATION <Solvent>

As the solvent, the following ones were used.

Solvent 1: Methoxypropanol (MP)

Solvent 2: Dimethyl formamide (DMF)

<Preparation of Pre-Reacted Epoxy Resin>

7 Kinds of the pre-reacted epoxy resin were prepared as shown below using the epoxy resin, the phosphorus compound and the like mentioned above.

(Pre-Reacted Epoxy Resin 1)

Epoxy resin 1 (70 parts by mass) and Phosphorus compound 1 (30 parts by mass) were heat-stirred in a mixed solvent of Solvent 1 (64.0 parts by mass) and Solvent 2 (2.67 parts by mass) at 115° C., and then 0.2 part by mass of triphenyl phosphine was added thereto, and the heat-stirring was continued, whereby to give Pre-reacted epoxy resin 1 having about 500 of the epoxy equivalent in the solid content, 60 mass % of the solid content, and about 2.9 mass % of the phosphorus content in the solid content.

(Pre-Reacted Epoxy Resin 2)

Epoxy resin 1 (60.9 parts by mass), Epoxy resin 6 (9.3 parts by mass) and Phosphorus compound 1 (29.8 parts by mass) were heat-stirred in Solvent 1 (53.8 parts by mass) at 115° C., and then 0.2 part by mass of triphenyl phosphine was added thereto, and the heat-stirring was continued, whereby to give Pre-reacted epoxy resin 2 having about 540 of the epoxy equivalent in the solid content, 65 mass % of the solid content, and about 2.9 mass % of the phosphorus content in the solid content.

(Pre-Reacted Epoxy Resin 3)

Epoxy resin 2 (67 parts by mass) and Phosphorus compound 1 (33 parts by mass) were heat-stirred under no solvent at 130° C., and then 0.2 part by mass of triphenyl phosphine was added thereto, and the heat-stirring was continued, whereby to give Pre-reacted epoxy resin 3 having about 500 of the epoxy equivalent.

(Pre-Reacted Epoxy Resin 4)

Epoxy resin 3 (70 parts by mass) and Phosphorus compound 3 (30 parts by mass) were heat-stirred under no solvent at 130° C., and then 0.2 part by mass of triphenyl phosphine was added thereto, and the heat-stirring was continued, whereby to give Pre-reacted epoxy resin 4 having about 300 of the epoxy equivalent.

(Pre-Reacted Epoxy Resin 5)

Epoxy resin 4 (75 parts by mass) and Phosphorus compound 1 (25 parts by mass) were heat-stirred under no solvent at 130° C., and then 0.2 part by mass of triphenyl phosphine was added thereto, and the heat-stirring was continued, whereby to give Pre-reacted epoxy resin 5 having about 420 of the epoxy equivalent.

(Pre-Reacted Epoxy Resin 6)

Epoxy resin 5 (75 parts by mass) and Phosphorus compound 1 (25 parts by mass) were heat-stirred under no solvent at 130° C., and then 0.2 part by mass of triphenyl phosphine was added thereto, and the heat-stirring was continued, whereby to give Pre-reacted epoxy resin 6 having about 430 of the epoxy equivalent.

(Pre-Reacted Epoxy Resin 7)

Epoxy resin 1 (70 parts by mass) and Phosphorus compound 2 (30 parts by mass) were heat-stirred under no solvent at 130° C., and then 0.2 part by mass of triphenyl phosphine was added thereto, and the heat-stirring was continued, whereby to give Pre-reacted epoxy resin 7 having about 540 of the epoxy equivalent.

To prepare the epoxy resin composition using those mentioned above, the pre-reacted epoxy resin, the other epoxy resin or the phosphorus compound, the inorganic filler, the hardening agent, the molybdenum compound, the inorganic filler coated with the molybdenum compound, the solvent, and other additives were put in, and mixed with "Homomixer" manufactured by Tokushu Kika Kogyo Co., Ltd. at about 1000 rpm for about 120 minutes, and further blended with the hardening accelerator, and stirred again for 30 minutes. Then, dispersion of the inorganic filler was performed with "Nanomill" manufactured by ASADA IRON WORKS. CO., LTD., and a varnish was prepared.

With the procedures mentioned above, the epoxy resin compositions for a prepreg of Examples 1 to 16 and Comparative Examples 1 to 4 were prepared in the blending amounts shown in the parentheses of Tables 1 and 2. Then, a prepreg, a copper-clad laminate, and a multilayer printed circuit board were manufactured using these with the procedures mentioned below. Furthermore, the pre-reacted resin in Tables 1 and 2 refers to a pre-reacted epoxy resin.

<Method of Manufacturing Prepreg>

The epoxy resin composition for a prepreg prepared with the procedures mentioned above as a varnish was impregnated into a glass cloth (WEA116E having 0.1 mm thickness, manufactured by Nitto Boseki Co., Ltd.), and dried in a dryer at a range of 120° C. to 190° C. for 5 to 10 minutes or so, whereby to manufacture a prepreg in the semi-hardened state (B-stage).

<Method of Manufacturing Copper-Clad Laminate>

The prepregs manufactured with the procedures mentioned above were overlapped in piece, 2 pieces, 4 pieces or 8 pieces, and further these prepregs were overlapped with copper foils on both sides thereof, and this was heated and pressurized at the conditions of 140 to 180° C. and 0.98 to 3.9 MPa, whereby to manufacture copper-clad laminates having a thickness of about 0.1 mm, about 0.2 mm and about 0.8 mm. Herein, the heating time was established such that the time when the total prepregs reach 160° C. or more was at least 90 minutes or more. In addition, at this time, the inside of the press was set to be in reduced pressure of 133 hPa or less. By the procedures mentioned above, it is possible to remove absorbed water of the prepreg effectively, and prevent residual void after the molding. Furthermore, as the copper foil, "GT" manufactured by Furukawa Circuit Foil Co., Ltd. (0.012 mm thickness) was used.

<Method of Manufacturing Multilayer Printed Circuit Board>

A multilayer printed circuit board was manufactured by the procedures described below using the prepreg and the copper-clad laminate having about 0.2 mm thickness obtained with the procedures mentioned above. First, the copper-clad laminate was formed with a circuit pattern whereby to manufacture a substrate for the inner layer, and then this copper foil of the circuit pattern (12 μm thickness) was subjected to etching treatment. Then, the copper foils were overlapped with both sides of this substrate for the inner layer via 1 piece of a prepreg, and laminated at the molding conditions similar to those of the copper-clad laminate, whereby to manufacture the multilayer printed circuit board.

Then, for the molded product obtained with the procedures mentioned above, evaluations for physical properties were performed shown below.

<Thermal Bending Modulus>

For the copper-clad laminate having 0.8 mm thickness, the copper foils were removed from the copper-clad laminate in the similar manner to those described above, which was cut into pieces having 100 mm of the length and 25 mm of the width, and the thermal bending modulus was measured in accordance with JIS C6481 under the atmosphere at 250° C.

<Boiling Solder Heat Resistance>

The copper foils were removed from the multilayered laminate comprising the substrate for the inner layer in the similar manner to those described above, which was cut into 50 mm square pieces to prepare 5 pieces of the cuts, which were boiled at 100° C. for 2 hours, 4 hours and 6 hours, and then dipped in 288° C. of a solder bath for 20 seconds, and then the abnormal appearance such as blister was observed.

Furthermore, for the observed results, no blister was indicated as ○, and occurrence of small blister was indicated as Δ.

<Number of Seconds on Average for Flame Retardance and Quenching>

The copper foils on the surfaces were removed by etching from the copper-clad laminate having 0.2 mm thickness, which was cut into pieces having 125 mm of the length and 13 mm of the width, and a test of combustion behavior was carried out in accordance with "Test for Flammability of Plastic Materials-UL94" of Under Writers Laboratories. In addition, to see the difference of quenching, the time on average from the ignition to the quenching was measured.

<Glass Transition Temperature (Tg)>

The copper foils on the surfaces were removed by etching from the copper-clad laminate having 0.8 mm thickness, which was cut into pieces having 50 mm of the length and 5 mm of the width, and tan δ was measured with a viscoelasticity spectrometer device, and the peak temperature was assumed as Tg.

<Heat Resistance>

The copper-clad laminate having 0.2 mm thickness was cut into 50 mm square pieces to prepare, and measurement of heat resistance was performed in accordance with JIS C6481.

<Thermal Decomposition Temperature>

The copper foils on the surfaces were removed by etching from the copper-clad laminate having 0.2 mm thickness, which was cut into φ5 pieces, and the weight change was measured with a thermal analysis device, and the temperature where 2% weight was reduced, was set as the thermal decomposition temperature.

<Hole Position Accuracy>

Using the copper-clad laminate having 0.4 mm thickness, it was processed at the conditions of φ0.15 drill diameter, 2000 krpm rotation number, 2.0 m/min feed rate, 4 pieces of the overlapping number, 70 μm aluminum board of the entry board, and backup board Bakelite, and the hole position accuracy was evaluated.

<Appearance After Acid Treatment>

The copper foils on the surfaces were removed by etching from the copper-clad laminate having 0.2 mm thickness, which was cut into 50 mm square pieces to prepare, and dipped in hydrochloric acid (2 mol/dm$^3$) at 23° C., and then the change of the appearance was found by visual observation.

<Peel-Strength for Copper Foil>

The copper-clad laminate having 0.8 mm thickness was prepared, and the peel-strength for the copper foil was measured in the normal state in accordance with JIS C6481.

The results of the above-mentioned evaluations of the physical properties are shown in Tables 1 to 3.

TABLE 1

| | A | | | | |
|---|---|---|---|---|---|
| | Example 1 | Example 2 | Example 3 | Example 4 | Example 5 |
| Epoxy resin (Weight %) | Pre-reacted epoxy resin 4(45) Epoxy resin 7 (55) | Pre-reacted epoxy resin 4(45) Epoxy resin 8 (55) | Pre-reacted epoxy resin 4(45) Epoxy resin 9 (55) | Pre-reacted epoxy resin 5(45) Epoxy resin 6 (55) | Pre-reacted epoxy resin 3(35) Epoxy resin 6 (65) |
| Phosphorus Compound | Included in those above | Included in those above | Included in those above | Included in those above | Included in those above |

TABLE 1-continued

| | | | | | | |
|---|---|---|---|---|---|---|
| Inorganic filler (Part by Weight) | Inorganic filler having thermal decomposition temperature of 400° C. or more | Filler 7 (70) | Filler 7 (70) | Filler 7 (70) | Filler 8 (70) | Filler 10 (70) |
| | Inorganic filler except for those above | Filler 1 (50) | Filler 1 (50) | Filler 1 (50) | Filler 1 (50) | Filler 1 (50) |
| Hardening agent (Part by Weight) | | Hardening agent 1 (4.2) | Hardening agent 1 (4.2) | Hardening agent 1 (4.8) | Hardening agent 1 (3.8) | Hardening agent 3 (45.2) |
| Hardening accelerator (Part by Weight) | | Hardening accelerator 1 (0.1) | Hardening accelerator 1 (0.1) | Hardening accelerator 1 (0.1) | Hardening accelerator 1 (0.1) | Hardening accelerator 1 (0.1) |
| Molybdenum Compound (Part by Weight) | | Molybdenum Compound 1 (1) | Molybdenum Compound 1 (1) | Molybdenum Compound 1 (1) | Molybdenum Compound 1 (1) | Molybdenum Compound 1 (1) |
| Inorganic filler coated with molybdenum Compound (Part by Weight) | | — | — | — | — | — |
| Content of pre-reacted epoxy resin (Weight %) "Total Weight to Epoxy resin" | | 45 | 45 | 45 | 45 | 35 |
| Epoxy group equivalent of bifunctional epoxy resin with respect to 1 equivalent of phenolic hydroxide group of phosphorus compound in pre-reacted epoxy resin | | 2.4 | 2.4 | 2.4 | 1.9 | 1.9 |
| Epoxy group equivalent of multifunctional epoxy resin with respect to 1 equivalent of phenolic hydroxide group of phosphorus compound in pre-reacted epoxy resin | | — | — | — | — | — |
| Phosphorus content in solid content of resin (Weight %) | | 1.30 | 1.30 | 1.30 | 1.04 | 0.71 |
| Thermal bending modulus (250° C.) | | 10 GPa | 10 GPa | 10 GPa | 10 GPa | 10 GPa |
| Boiling Solder Heat resistance (288° C. Solder 20S Dipping) | | | | | | |
| 2 hr Boiling | | ○○○○○ | ○○○○○ | ○○○○○ | ○○○○○ | ○○○○○ |
| 4 hr Boiling | | ○○○○○ | ○○○○○ | ○○○○○ | ○○○○○ | ○○○○○ |
| 6 hr Boiling | | ○○○△△ | ○○○△△ | ○○○△△ | ○○○△△ | ○○○△△ |
| Flame retardance (UL 94) | | 1.5 Seconds | 1.5 Seconds | 1.5 Seconds | 2 Seconds | 2.5 Seconds |
| Tg(DMA) | | 200° C. | 200° C. | 210° C. | 200° C. | 200° C. |
| Heat resistance | | 260° C. | 260° C. | 260° C. | 260° C. | 270° C. |
| Thermal decomposition temperature (TG) | | 300° C. | 300° C. | 300° C. | 300° C. | 300° C. |
| Hole Position Accuracy | | 25 μm | 25 μm | 25 μm | 25 μm | 25 μm |
| Appearance after acid treatment | | ○ | ○ | ○ | ○ | ○ |
| Peel-strength for copper foil | | 1.0 kN/m | 1.0 kN/m | 1.0 kN/m | 1.0 kN/m | 1.0 kN/m |

B

| | | Example 6 | Example 7 | Example 8 | Example 9 | Example 10 |
|---|---|---|---|---|---|---|
| Epoxy resin (Weight %) | | Pre-reacted epoxy resin 6 (45) Epoxy resin 6 (55) | Pre-reacted epoxy resin 7 (30) Epoxy resin 6 (70) | Pre-reacted epoxy resin 1 (52) Epoxy resin 6 (48) | Pre-reacted epoxy resin 2 (50) Epoxy resin 6 (50) | Pre-reacted epoxy resin 2 (50) Epoxy resin 6 (50) |
| Phosphorus Compound | | Included in those above | Included in those above | Included in those above | Included in those above | Included in those above |
| Inorganic filler (Part by Weight) | Inorganic filler having thermal decomposition temperature of 400° C. or more | Filler 9 (70) | Filler 8 (70) | Filler 10 (70) | Filler 10 (70) | Filler 10 (70) |
| | Inorganic filler except for those above | Filler 1 (50) | Filler 1 (50) | Filler 2 (50) | Filler 2 (50) | Filler 2 (50) |
| Hardening agent (Part by Weight) | | Hardening agent 1 (3.8) | Hardening agent 1 (4.0) | Hardening agent 1 (4.0) | Hardening agent 2 (38.8) | Hardening agent 2 (38.8) |
| Hardening accelerator (Part by Weight) | | Hardening accelerator 1 (0.1) | Hardening accelerator 1 (0.1) | Hardening accelerator 1 (0.1) | Hardening accelerator 1 (0.1) | Hardening accelerator 1 (0.1) |
| Molybdenum Compound (Part by Weight) | | Molybdenum Compound 1 (1) | Molybdenum Compound 1 (1) | Molybdenum Compound 1 (1) | Molybdenum Compound 1 (1) | Molybdenum Compound 1 (5) |
| Inorganic filler coated with molybdenum Compound (Part by Weight) | | — | — | — | — | — |
| Content of pre-reacted epoxy resin (Weight %) "Total Weight to Epoxy resin" | | 45 | 30 | 52 | 50 | 50 |
| Epoxy group equivalent of bifunctional epoxy resin | | 1.7 | 2.4 | 2.0 | 1.8 | 1.8 |

TABLE 1-continued

|  | | | | | |
|---|---|---|---|---|---|
| with respect to 1 equivalent of phenolic hydroxide group of phosphorus compound in pre-reacted epoxy resin | | | | | |
| Epoxy group equivalent of multifunctional epoxy resin with respect to 1 equivalent of phenolic hydroxide group of phosphorus compound in pre-reacted epoxy resin | — | — | — | 0.3 | 0.3 |
| Phosphorus content in solid content of resin (Weight %) | 1.04 | 0.71 | 1.50 | 1.04 | 1.04 |
| Thermal bending modulus (250° C.) | 10 GPa | 10 GPa | 10 GPa | 10 GPa | 10 GPa |
| Boiling Solder Heat resistance (288° C. Solder 20S Dipping) | | | | | |
| 2 hr Boiling | ○○○○○ | ○○○○○ | ○○○○○ | ○○○○○ | ○○○○○ |
| 4 hr Boiling | ○○○○○ | ○○○○○ | ○○○○○ | ○○○○○ | ○○○○○ |
| 6 hr Soiling | ○○○○○ | ○○○○○ | ○○○○○ | ○○○○○ | ○○○△△ |
| Flame retardanee (UL 94) | 2 Seconds | 2.5 Seconds | 1.5 Seconds | 2 Seconds | 2 Seconds |
| Tg(DMA) | 200° C. | 220° C. | 210° C. | 210° C. | 210° C. |
| Heat resistance | 260° C. | 260° C. | 260° C. | 280° C. | 260° C. |
| Thermal decomposition temperature (TG) | 300° C. | 300° C. | 300° C. | 300° C. | 260° C. |
| Hole Position Accuracy | 25 μm | 25 μm | 25 μm | 25 μm | 24 μm |
| Appearance after acid treatment | ○ | ○ | ○ | ○ | ○ |
| Peel-strength for copper foil | 1.0 kN/m | 1.0 kN/m | 1.0 kN/m | 1.0 kN/m | 1.0 kN/m |

TABLE 2

| | A | | | | |
|---|---|---|---|---|---|
| | Example 11 | Example 12 | Example 13 | Example 14 | Example 15 |
| Epoxy resin (Weight %) | Pre-reacted epoxy resin 2(50) Epoxy resin 6 (50) | Pre-reacted epoxy resin 2(50) Epoxy resin 6 (50) | Pre-reacted epoxy resin 2(50) Epoxy resin 6 (50) | Pre-reacted epoxy resin 2(50) Epoxy resin 6 (50) | Pre-reacted epoxy resin 2(50) Epoxy resin 6 (50) |
| Phosphorus Compound | Included in those above | Included in those above | Included in those above | Included in those above | Included in those above |
| Inorganic filler (Part by Weight) — Inorganic filler having thermal decomposition temperature of 400° C. or more | Filler 10 (70) | Filler 10 (70) | Filler 10 (70) | Filler 10 (70) | Filler 10 (70) |
| Inorganic filler except for those above | Filler 2 (50) | Filler 2 (50) | Filler 2 (50) | Filler 2 (50) | Filler 2 (50) |
| Hardening agent (Part by Weight) | Hardening agent 2 (38.8) | Hardening agent 4 (40.7) | Hardening agent 2 (38.8) | Hardening agent 2 (38.8) | Hardening agent 2 (38.8) |
| Hardening accelerator (Part by Weight) | Hardening accelerator 1 (0.1) | Hardening accelerator 1 (0.1) | Hardening accelerator 1 (0.1) | Hardening accelerator 1 (0.1) | Hardening accelerator 1 (0.1) |
| Molybdenum Compound (Part by Weight) | — | — | — | — | — |
| Inorganic filler coaled with molybdenum Compound (Part by Weight) | Molybdenum Compound coated inorganic filler 1 (5) | Molybdenum Compound coated inorganic filler 1 (5) | Molybdenum Compound coated inorganic filler 2 (5) | Molybdenum Compound coated inorganic filler 3 (5) | Molybdenum Compound coated inorganic filler 4 (5) |
| Content of pre-reacted epoxy resin (Weight %) "Total Weight to Epoxy resin" | 50 | 50 | 50 | 50 | 50 |
| Epoxy group equivalent of bifunctional epoxy resin with respect to 1 equivalent of phenolic hydroxide group of phosphorus compound in pre-reacted epoxy resin | 1.8 | 1.8 | 1.8 | 1.8 | 1.8 |
| Epoxy group equivalent of multifunctional epoxy resin with respect to 1 equivalent of phenolic hydroxide group of phosphorus compound in pre-reacted epoxy resin | 0.3 | 0.3 | 0.3 | 0.3 | 0.3 |
| Phosphorus content in solid content of resin (Weight %) | 1.04 | 1.02 | 1.04 | 1.04 | 1.04 |
| Thermal bending modulus (250° C.) | 10 GPa | 10 GPa | 10 GPa | 10 GPa | 10 GPa |

TABLE 2-continued

| Boiling Solder Heat resistance (288° C. Solder 20S Dipping) | | | | | |
|---|---|---|---|---|---|
| 2 hr Boiling | ○○○○○ | ○○○○○ | ○○○○○ | ○○○○○ | ○○○○○ |
| 4 hr Boiling | ○○○○○ | ○○○○○ | ○○○○○ | ○○○○○ | ○○○○○ |
| 6 hr Boiling | ○○○○○ | ○○○○○ | ○○○○○ | ○○○○○ | ○○○○○ |
| Flame retardance (UL 94) | 1 Second | 1 Second | 1 Second | 1 Second | 1 Second |
| Tg(DMA) | 210° C. | 190° C. | 210° C. | 210° C. | 210° C. |
| Heat resistance | 280° C. | 280° C. | 280° C. | 280° C. | 280° C. |
| Thermal decomposition temperature (TG) | 300° C. | 300° C. | 300° C. | 300° C. | 300° C. |
| Hole Position Accuracy | 22 μm | 22 μm | 23 μm | 22 μm | 22 μm |
| Appearance after acid treatment | ○ | ○ | ○ | ○ | ○ |
| Peel-strength for copper foil | 1.0 kN/m | 1.0 kN/m | 1.0 kN/m | 1.0 kN/m | 1.0 kN/m |

B

| | Example 16 | Example 17 | Example 18 | Example 19 |
|---|---|---|---|---|
| Epoxy resin (Weight %) | Pre-reacted epoxy resin 2(50) Epoxy resin 6 (50) | Pre-reacted epoxy resin 2(50) Epoxy resin 6 (50) | Pre-reacted epoxy resin 2(50) Epoxy resin 6 (50) | Pre-reacted epoxy resin 2(50) Epoxy resin 6 (50) |
| Phosphorus Compound | Included in those above | Included in those above | Included in those above | Included in those above |
| Inorganic filler (Part by Weight) — Inorganic filler having thermal decomposition temperature of 400° C. or more | Filler 10 (70)/ Filler 4 (50) | Filler 10 (70)/ Filler 5 (50) | Filler 10 (70)/ Filler 6 (50) | Filler 10 (200) |
| Inorganic filler except for those above | — | — | — | — |
| Hardening agent (Part by Weight) | Hardening agent 2 (38.8) | Hardening agent 2 (38.8) | Hardening agent 2 (38.8) | Hardening agent 2 (38.8) |
| Hardening accelerator (Part by Weight) | Hardening accelerator 1 (0.1) | Hardening accelerator 1 (0.1) | Hardening accelerator 1 (0.1) | Hardening accelerator 1 (0.1) |
| Molybdenum Compound (Part by Weight) | — | — | — | — |
| Inorganic filler coated with molybdenum Compound (Part by Weight) | Molybdenum Compound coated inorganic filler 4 (5) | Molybdenum Compound coated inorganic filler 4 (5) | Molybdenum Compound coated inorganic filler 4 (5) | Molybdenum Compound coated inorganic filter 4 (5) |
| Content of pre-reacted epoxy resin (Weight %) "Total Weight to Epoxy resin" | 50 | 50 | 50 | 50 |
| Epoxy group equivalent of bifunctional epoxy resin with respect to 1 equivalent of phenolic hydroxide group of phosphorus compound in pre-reacted epoxy resin | 1.8 | 1.8 | 1.8 | 1.8 |
| Epoxy group equivalent of multifunctional epoxy resin with respect to 1 equivalent of phenolic hydroxide group of phosphorus compound in pre-reacted epoxy resin | 0.3 | 0.3 | 0.3 | 0.3 |
| Phosphorus content in solid content of resin (Weight %) | 1.04 | 1.04 | 1.04 | 1.04 |
| Thermal bending modulus (250° C.) | 10 GPa | 10 GPa | 10 GPa | 15 GPa |
| Boiling Solder Heat resistance (288° C. Solder 20S Dipping) | | | | |
| 2 hr Boiling | ○○○○○ | ○○○○○ | ○○○○○ | ○○○○○ |
| 4 hr Boiling | ○○○○○ | ○○○○○ | ○○○○○ | ○○○○○ |
| 6 hr Boiling | ○○○○○ | ○○○○○ | ○○○○○ | ○○○○○ |
| Flame retardance (UL 94) | 1 Second | 1 Second | 1 Second | 1 Second |
| Tg(DMA) | 210° C. | 210° C. | 210° C. | 210° C. |
| Heat resistance | 290° C. | 290° C. | 290° C. | 290° C. |
| Thermal decomposition temperature (TG) | 350° C. | 350° C. | 350° C. | 370° C. |
| Hole Position Accuracy | 21 μm | 21 μm | 21 μm | 23 μm |
| Appearance after acid treatment | ○ | ○ | ○ | ○ |
| Peel-strength for copper foil | 0.8 kN/m | 0.8 kN/m | 0.9 kN/m | 0.7 kN/m |

TABLE 3

|  |  | Comparative Example 1 | Comparative Example 2 | Comparative Example 3 | Comparative Example 4 |
|---|---|---|---|---|---|
| Epoxy resin (Weight %) | | Pre-reacted epoxy resin 1 (52) Epoxy resin 6 (48) | Pre-reacted epoxy resin 2 (50) Epoxy resin 6 (50) | Pre-reacted epoxy resin 2 (50) Epoxy resin 6 (50) | Pre-reacted epoxy resin 2 (66) Epoxy resin 6 (34) |
| Phosphorus Compound | | Included in those above | Included in those above | Included in those above | Included in those above |
| Inorganic filler (Part by Weight) | Inorganic filler having thermal decomposition temperature of 400° C. or more | Filler 10 (70) | Filler 10 (70) | Filler 10 (70)/ Filler 3 (50) | — |
| | Inorganic filler except for those above | Filler 2 (50) | Filler 2 (50) | — | Filler 2 (28.3) |
| Hardening agent (Part by Weight) | | Hardening agent 1 (4.0) | Hardening agent 2 (38.8) | Hardening agent 2 (38.8) | Hardening agent 1 (3.6) |
| Hardening accelerator (Part by Weight) | | Hardening accelerator 1 (0.1) | Hardening accelerator 1 (0.1) | Hardening accelerator 1 (0.1) | Hardening accelerator 1 (0.1) |
| Molybdenum Compound (Part by Weight) | | — | — | — | — |
| Inorganic filler coated with molybdenum Compound (Part by Weight) | | — | — | — | — |
| Content of pre-reacted epoxy resin (Weight %) | | 52 | 50 | 50 | 66 |
| "Total Weight to Epoxy resin" Epoxy group equivalent of bifunctional epoxy resin with respect to 1 equivalent of phenolic hydroxide group of phosphorus compound in pre-reacted epoxy resin | | 2 | 1.8 | 1.8 | 1.8 |
| Epoxy group equivalent of multifunctional epoxy resin with respect to 1 equivalent of phenolic hydroxide group of phosphorus compound in pre-reacted epoxy resin | | — | 0.3 | 0.3 | 0.3 |
| Phosphorus content in solid content of resin (Weight %) | | 1.5 | 1.04 | 1.04 | 1.85 |
| Thermal bending modulus (250° C.) | | 10 GPa | 10 GPa | 10 GPa | 6.5 GPa |
| Boiling Solder Heat resistance (288° C. Solder 20S Dipping) | | | | | |
| 2 hr Boiling | | ○○○○○ | ○○○○○ | ○○○○○ | ○○○○○ |
| 4 hr Boiling | | ○○○○○ | ○○○○○ | ○○○○○ | ○○○○○ |
| 6 hr Boiling | | ○○○○○ | ○○○○○ | ○○○○○ | ○○△△△ |
| Flame retardance (UL 94) | | 2.5 Seconds | 3 Seconds | 3 Seconds | 3 Seconds |
| Tg (DMA) | | 210° C. | 210° C. | 210° C. | 220° C. |
| Heat resistance | | 260° C. | 280° C. | 290° C. | 260° C. |
| Thermal decomposition temperature (TG) | | 300° C. | 300° C. | 350° C. | 350° C. |
| Hole Position Accuracy | | 30 μm | 30 μm | 30 μm | 28 μm |
| Appearance after acid treatment | | ○ | ○ | X | ○ |
| Peel-strength for copper foil | | 1.0 kN/m | 1.0 kN/m | 0.8 kN/m | 1.0 kN/m |

<Results of Evaluation>

From each of the measurement results mentioned above, it was found out that those of Examples had excellent flame retardance, heat resistance, thermal stiffness and hole position accuracy. Particularly, any of Examples 1 to 19 in which the molybdenum compound was blended, showed excellent results for the hole position accuracy, in comparison to Comparative Examples 1 to 4 in which the molybdenum compound was not blended.

In addition, Examples 11 to 19 using the inorganic filler coated with the molybdenum compound instead of the molybdenum compounds of Examples 1 to 10, showed excellent results particularly for the flame retardance and hole position accuracy.

In addition, Examples 16 to 19, in which Filler 10 and Fillers 4 to 6 were used as the above-mentioned inorganic filler having 400° C. or more of the thermal decomposition temperature, showed further excellent hole position accuracy.

With respect to the inorganic filler, it was found out that Comparative Example 3, in which a combination of Filler 10, and Filler 3 that was magnesium hydroxide with no surface treatment, were used as an inorganic filler having the thermal decomposition temperature of 400° C., showed worse appearance after the acid treatment.

Comparative Example 4, which had 66 mass % of the blending amount of the pre-reacted epoxy resin with respect to the total epoxy resins, which was out of the range of 20 mass % or more and 55 mass % or less of the invention range, showed low value in the thermal bending modulus.

From the results mentioned above, it was found out that the multilayer printed circuit board prepared using the epoxy resin for a prepreg of the invention was a multilayer printed circuit board that was excellent in flame retardance, heat resistance, thermal stiffness and hole position accuracy.

The invention claimed is:

1. An epoxy resin composition for a prepreg obtained by blending a pre-reacted epoxy resin, an epoxy resin which is not pre-reacted, a hardening agent, an inorganic filler, and a molybdenum compound, wherein:
the pre-reacted epoxy resin is obtained by reacting a phosphorus compound with (i) a bifunctional epoxy resin and a multi-functional epoxy resin, or (ii) the bifunctional epoxy resin only, in advance, the epoxy resin which is not pre-reacted is a bifunctional epoxy resin or a multi-functional epoxy resin when the pre-reacted epoxy resin is obtained by reacting the phosphorus compound with (i), the epoxy resin which is not pre-reacted is a multi-functional epoxy resin when the pre-reacted epoxy resin is obtained by reacting the phosphorus compound with (ii), the phosphorus compound has 1.8 or more and less than 3 on average of a phenolic hydroxyl group that is reactive to an epoxy resin in the molecule, and that has 0.8 or more on average of a phosphorus element, the bifunctional epoxy resins have 1.8 or more and less than 2.6 on average of epoxy groups in the molecule, the multi-functional epoxy resins contain 2.8 or more on average of epoxy groups in one molecule, and the inorganic filler is used in a blending amount of 110 parts or more by mass and less than 200 parts by mass with respect to 100 parts by mass total of the pre-reacted epoxy resin and the epoxy resin which is not pre-reacted.

2. The epoxy resin composition for a prepreg according to claim 1, wherein:

the pre-reacted epoxy resin is used in a blending amount of 20 mass % or more and 55 mass % or less with respect to the total of the pre-reacted epoxy resin and the epoxy resin which is not pre-reacted, the bifunctional epoxy resins are at least one kind selected from the group consisting of a biphenyl type epoxy resin represented by Chemical formula (1), a naphthalene type epoxy resin represented by Chemical formula (2), a special bifunctional epoxy resin represented by Chemical formula (3), a dicyclopentadiene-containing bifunctional epoxy resin represented by Chemical formula (4), and a phenol aralkyl-containing bifunctional epoxy resin represented by Chemical formula (5), described below, the hardening agent is at least one of a dicyandiamide and multi-functional phenolic compound, and the molybdenum compound is used in a blending amount of 0.05 part or more by mass and less than 5 parts by mass with respect to 100 parts by mass total of the pre-reacted epoxy resin and the epoxy resin which is not pre-reacted:

[Chemical formula 1]

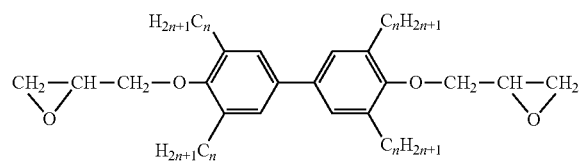

(1)

wherein n represents an integer of 0 to 4;

[Chemical formula 2]

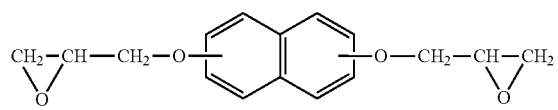

(2)

[Chemical formula 3]

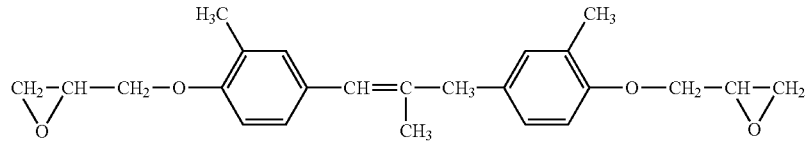

(3)

[Chemical formula 4]

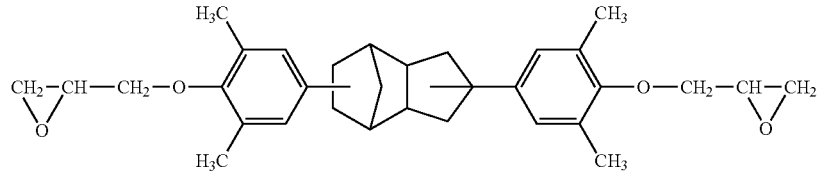

(4)

[Chemical formula 5]

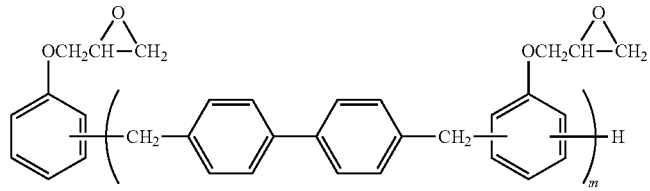

(5)

wherein m is an integer represented the repetition number.

3. The epoxy resin composition for a prepreg according to claim 1, wherein the pre-reacted epoxy resin is obtained from an equivalent reaction ratio such that the epoxy equivalent of the bifunctional epoxy resin is 1.2 equivalents or more and less than 3 equivalents, with respect to 1 equivalent of the phenolic hydroxyl groups of the phosphorus compound; and the epoxy equivalent of the multi-functional epoxy resin, when present, is 0.05 equivalent or more and less than 0.8 equivalent, with respect to 1 equivalent of the phenolic hydroxyl groups of the phosphorus compound.

4. The epoxy resin composition for a prepreg according to claim 1,
wherein the phosphorus compound is a phosphorus compound represented by any one of Chemical formula (6), Chemical formula (7) and Chemical formula (8) described below:

[Chemical formula 6]

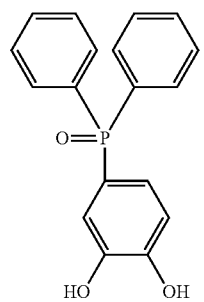

(6)

[Chemical formula 7]

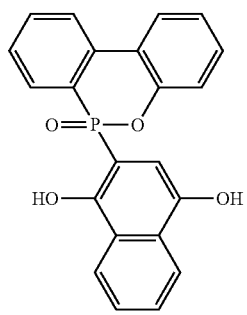

(7)

[Chemical formula 8]

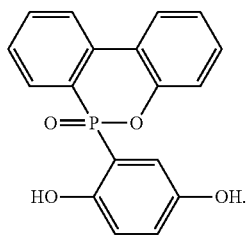

(8)

5. The epoxy resin composition for a prepreg according to claim 1,
wherein the content of the phosphorus element is 0.5 mass % or more and less than 3.5 mass % with respect to the total of the pre-reacted epoxy resin and the epoxy resin which is not pre-reacted.

6. The epoxy resin composition for a prepreg according to claim 1,
wherein the multi-functional epoxy resins contain benzene rings linked by a bond other than a methylene bond.

7. The epoxy resin composition for a prepreg according to claim 1,
wherein the inorganic filler is magnesium hydroxide alone or a mixture of magnesium hydroxide with another inorganic filler.

8. The epoxy resin composition for a prepreg according to claim 7,
wherein the magnesium hydroxide has a coating layer composed of silica on the surface thereof.

9. The epoxy resin composition for a prepreg according to claim 8,
wherein the magnesium hydroxide has a second coating layer composed of at least one kind selected from alumina, titania, and zirconia on the coating layer composed of silica.

10. The epoxy resin composition for a prepreg according to claim 8,
wherein the magnesium hydroxide is surface-treated with a surface treatment agent that is at least any one kind of a coupling agent and a siloxane oligomer after formation of the coating layer composed of silica.

11. The epoxy resin composition for a prepreg according to claim 2,
wherein the multi-functional phenolic compound used as a hardening agent is any multi-functional phenolic compound represented by Chemical formula (9) or (10) described below:

[Chemical formula 9]

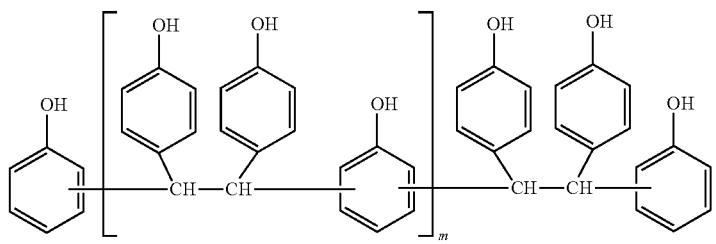

(9)

wherein m is an integer representing the repetition number; and

[Chemical formula 10]

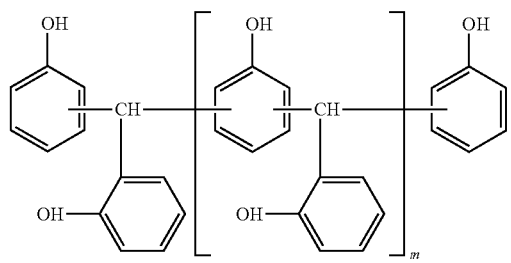

(10)

wherein m is an integer representing the repetition number.

12. The epoxy resin composition for a prepreg according to claim 1,
    wherein the molybdenum compound is zinc molybdate.

13. The epoxy resin composition for a prepreg according to claim 1,
    wherein the molybdenum compound is coated on the inorganic filler.

14. The epoxy resin composition for a prepreg according to claim 13,
    wherein the inorganic filler on which the molybdenum compound is coated is at least any one kind of talc, aluminum hydroxide, boehmite, magnesium hydroxide, and silica.

15. The epoxy resin composition for a prepreg according to claim 13,
    wherein the inorganic filler on which the molybdenum compound is coated has an average particle diameter of 0.05 μm or more.

16. A prepreg obtained by,
    impregnating the epoxy resin composition for a prepreg according to claim 1 into a base to obtain the prepreg in a semi-hardened state.

17. A multilayer printed circuit board,
    being obtained by laminating the prepreg of claim 16 on a substrate for the inner layer on which a circuit pattern is formed.

* * * * *